(12) United States Patent
Noda (10) Patent No.: US 7,989,862 B2
(45) Date of Patent: Aug. 2, 2011

(54) SEMICONDUCTOR DEVICE AND ITS MANUFACTURING METHOD

(75) Inventor: Takafumi Noda, Matsumoto (JP)

(73) Assignee: Seiko Epson Corporation (JP)

( * ) Notice: Subject to any disclaimer, the term of this patent is extended or adjusted under 35 U.S.C. 154(b) by 135 days.

(21) Appl. No.: 12/042,856

(22) Filed: Mar. 5, 2008

(65) Prior Publication Data

US 2008/0303074 A1    Dec. 11, 2008

(30) Foreign Application Priority Data

Mar. 6, 2007  (JP) .................................. 2007-055335

(51) Int. Cl.
*H01L 27/108* (2006.01)
*H01L 21/02* (2006.01)

(52) U.S. Cl. . 257/295; 257/903; 257/904; 257/E27.104; 257/E21.585

(58) Field of Classification Search .................. 438/675; 257/295, 903, 904, E27.104, E21.585
See application file for complete search history.

(56) References Cited

U.S. PATENT DOCUMENTS

| 6,680,499 | B2 | 1/2004 | Kumura et al. |
| 6,867,451 | B2 | 3/2005 | Hieda et al. |
| 2002/0096734 | A1* | 7/2002 | Natsume ........................ 257/508 |
| 2002/0109231 | A1 | 8/2002 | Chu et al. |
| 2003/0032219 | A1* | 2/2003 | Nam et al. ..................... 438/128 |
| 2004/0094791 | A1* | 5/2004 | Ito et al. ......................... 257/310 |
| 2004/0235260 | A1* | 11/2004 | Lee et al. ........................ 438/396 |
| 2005/0121713 | A1 | 6/2005 | Toshiba et al. |
| 2007/0032015 | A1 | 2/2007 | Itoh et al. |
| 2007/0120165 | A1* | 5/2007 | Matsuura ...................... 257/296 |
| 2009/0127657 | A1* | 5/2009 | Sashida ......................... 257/532 |

FOREIGN PATENT DOCUMENTS

| JP | 06-177347 | 6/1994 |
| JP | 07-099290 | 4/1995 |
| JP | 2000-243931 | 9/2000 |
| JP | 2002-217381 | 8/2002 |
| JP | 2002-252337 | 9/2002 |
| JP | 2004-172232 | 6/2004 |
| JP | 2006-287261 | 10/2006 |
| JP | 2007-036126 | 2/2007 |

* cited by examiner

*Primary Examiner* — Long K Tran
(74) *Attorney, Agent, or Firm* — Harness, Dickey & Pierce, P.L.C.

(57) ABSTRACT

A semiconductor device is equipped with a plug conductive layer formed in an interlayer dielectric film on a substrate, and a conductive member provided on the plug conductive layer. The semiconductor device further includes a spacer dielectric film formed on the interlayer dielectric film and having a hole section connecting to the plug conductive layer; and a spacer conductive section embedded in the hole section of the spacer dielectric film, connected to the plug conductive layer and connected to the conducive member, wherein the spacer conductive section is formed from a conductive material having self-orientation characteristic, and a top surface of the spacer dielectric film and a top surface of the spacer conductive section are planarized.

11 Claims, 4 Drawing Sheets

SEMICONDUCTOR DEVICE AND ITS MANUFACTURING METHOD

The entire disclosure of Japanese Patent Application No. 2007-055335, filed Mar. 6, 2007 is expressly incorporated by reference herein.

BACKGROUND

1. Technical Field

The present invention relates to semiconductor devices and methods for manufacturing the same.

2. Related Art

Ferroelectric memory devices (FeRAM) are nonvolatile memory devices capable of low voltage and high-speed operation, and their memory cells can be each formed from one transistor and one capacitor (1T/1C). Accordingly, ferroelectric memory devices can achieve integration at the same level of that of DRAM, and are therefore expected as large-capacity nonvolatile memories.

As such ferroelectric memory devices, primarily, the stacked type is known. The stacked type includes a switching transistor provided below an interlayer dielectric film and a ferroelectric capacitor provided on the interlayer dielectric film, which are connected with each other through a plug conductive layer provided in a contact hole (through hole) formed in the interlayer dielectric film. Also, the ferroelectric capacitor has a structure in which a first electrode, a ferroelectric film and a second electrode are laminated. An upper interlayer dielectric film is formed in a manner to cover the ferroelectric capacitor, and the second electrode of the ferroelectric capacitor is connected to a wiring provided on the upper interlayer dielectric film through a plug conductive layer in a contact hole, like the lower interlayer dielectric film. A ferroelectric capacitor having the structure described above is described, for example, in Japanese Laid-open Patent Application JP-A-7-99290.

In the capacitor having the stacked structure described above, the crystal orientation of each of the layers is influenced by the crystal orientation of their lower layers, and therefore the control of crystal orientation of each of the layers serving as a base layer is very important. In particular, as the ferroelectric capacitor is formed on and extends across the plug conductive layer and the interlayer dielectric film, their top surfaces need to be sufficiently planarized. However, as the material for the plug conductive layer, tungsten (W) is generally used, and it is difficult to form the plug conductive layer with a sufficiently flat surface, as tungsten has relatively large crystal grains, and its surface would likely generate unevenness such as seams and roughness. When their surface is planarized by polishing, the surface of the plug conductive layer would be excessively polished, and recesses (concave sections) would be generated in the surface.

To address such a problem, a conductive body may be placed between the plug conductive layer and the interlayer dielectric film, as described in the aforementioned document. However, in the aforementioned document, a conductive body placed between the top surface of the plug conductive layer and the top surface of the interlayer dielectric layer is functioned as an oxygen barrier film or a hydrogen barrier film, but is not used for the purpose of planarization.

Also, the aforementioned document does not provide a solution to the problem in the planarization caused by the aforementioned recesses. As a countermeasure, it is possible to use a method in which the top surface of the interlayer dielectric layer and recesses on the top surface of the plug conductive layers are filled with a conductive body. However, the recesses are byproducts that are generated at the time of polishing, and therefore their depths are not uniform. Therefore, if the surface is planarized by polishing after the recesses have been filled with the conductive body, portions of the conductive body at shallow recesses may be removed, and the uneven surface of the tungsten plug may be partially exposed.

It is difficult to sufficiently planarize the tungsten surface as described above; and if a ferroelectric capacitor is formed on the uneven tungsten surface where unevenness such as seams and roughness remain, the ferroelectric capacitor would have portions whose crystal orientation is deviated, and therefore its ferroelectric property would be deteriorated. Furthermore, when a plug conductive layer that connects to a wiring section is formed on the ferroelectric capacitor, defective filling of the plug conductive layer may occur due to the aforementioned unevenness of the tungsten surface. When such defective filling occurs, weak points are formed at the interface between the ferroelectric capacitor and the plug conductive layer, and hydrogen gas that is used when forming the plug conductive layer on the ferroelectric capacitor would likely pass through the weak points and penetrate into the ferroelectric capacitor, which would deteriorate the ferroelectric capacitor.

SUMMARY

In accordance with an advantage of some aspects of the invention, it is possible to provide a semiconductor device with well aligned crystal orientation and good quality through sufficiently planarizing the top surface of the plug conductive layer, and its manufacturing method.

A semiconductor device in accordance with an embodiment of the invention pertains to a semiconductor device equipped with a plug conductive layer formed in an interlayer dielectric film on a substrate, and a conductive member provided on the plug conductive layer, and includes a spacer dielectric film formed on the interlayer dielectric film and having a hole section connecting to the plug conductive layer, and a spacer conductive section embedded in the hole section of the spacer dielectric film, connected to the plug conductive layer and connected to the conducive member, wherein the spacer conductive section is formed from a conductive material having a self-orientation characteristic, and a top surface of the spacer dielectric film and a top surface of the spacer conductive section are planarized.

The semiconductor device described above has the spacer dielectric film formed therein, such that the space (concave section) between the top surface of the spacer dielectric film and the top surface of the plug conductive layer can be made to a predetermined depth, unlike the recess (concave section) that may be created when the top surface of the interlayer dielectric film and the top surface of the plug conductive layer are planarized in which the depth thereof cannot be predicted. Accordingly, the thickness of the spacer conductive section to be formed in this space can be made sufficiently deeper (thicker) than the depth of the recess, and can be made uniform. Accordingly, when the spacer conductive section and the top surface of the spacer dielectric film are planarized by polishing, the spacer conductive section can be prevented from being removed, the uneven surface on the plug conductive layer can be securely covered, and the top surface of the plug conductive layer can be planarized much better.

Also, the spacer conductive section formed on the plug conductive layer has a self-orientation characteristic, such that the spacer conductive section has well aligned crystal orientation without being affected by the unevenness of the top surface of the plug conductive layer. Accordingly, the conductive member formed on the spacer conductive section can have good crystal orientation.

The interlayer dielectric film may preferably be formed from dielectric films in two or more layers, and at least the topmost layer among the dielectric films may preferably be composed of a material different from the material of the spacer dielectric film.

As a result, the difference in etching rate between the material of the spacer dielectric film and the material of the topmost layer may be used in the step of forming the hole section of the spacer dielectric film, whereby the lower layer side can be prevented from being etched even when the spacer dielectric film is over-etched. Accordingly, the hole section can be formed in a desired depth.

Also, the conductive member may be a component of the ferroelectric capacitor. As a result, the capacitor formed on the conductive member has well aligned crystal orientation, as the conductive member has well aligned crystal orientation as described above. Accordingly, the capacitor can be obtained with excellent ferroelectric characteristic.

Also, the spacer dielectric film may preferably have a barrier property against hydrogen. As a result, after the ferroelectric capacitor has been fabricated, the capacitor can be prevented from being reduced by hydrogen and water penetrating through the bottom surface side of the capacitor, and therefore the ferroelectric characteristic of the capacitor can be prevented from being damaged.

Also, the conductive member may preferably be a conductive barrier film that composes a base layer defining the lowermost layer of the ferroelectric capacitor, and the spacer conductive section may preferably be composed of the same material as that of the barrier film.

As a result, the conductive member is prevented from being oxidized to have a higher resistance, or the ferroelectric capacitor is prevented from being reduced at its lower side to deteriorate. Also, by forming the spacer conductive section and the conductive member from the same material, similar processing devices can be used when forming the spacer conductive section and the conductive member, and therefore independent processing apparatuses are not required for forming the spacer conductive section and the conductive member.

A method for manufacturing a semiconductor device in accordance with an embodiment of the invention pertains to a method for manufacturing a semiconductor device equipped with a plug conductive layer formed in an interlayer dielectric film on a substrate, and a conductive member provided on the plug conductive layer, and includes the steps of: forming a through hole in the interlayer dielectric film on the substrate; forming a film of plug conductive material on the interlayer dielectric film, thereby filling the plug conductive material in the through hole; planarizing the film of plug conductive material, thereby removing the plug conductive material from the surface of the interlayer dielectric film and forming a plug conductive layer composed of the plug conductive material in the through hole; forming a spacer dielectric film by forming a film of dielectric material on the interlayer dielectric film and forming a hole section connecting to the plug conductive layer in the film of dielectric material; forming a film of conductive material having self-orienting characteristic on the interlayer dielectric film, thereby filling the conductive material having self-orienting characteristic in the hole section; and planarizing the film of the conductive material having self orienting characteristic, thereby removing the conductive material having self orienting characteristic from the surface of the spacer dielectric film and forming a spacer conductive section composed of the conductive material having self-orienting characteristic in the hole section.

As a result, a semiconductor device that has the spacer conductive section in a predetermined thickness between the plug conductive layer and the conductive member can be manufactured. Also, for example, when a ferroelectric capacitor is formed above the spacer conductive section, the formed ferroelectric capacitor has well aligned crystal orientation without being affected by the uneven top surface of the plug conductive layer, and has excellent ferroelectric characteristic, because the spacer conductive section is formed from a material having self-orientation characteristic.

DESCRIPTION OF EXEMPLARY EMBODIMENTS

As a semiconductor device in accordance with an embodiment of the invention, the case where the invention is applied to a ferroelectric memory device is described below. It should be noted that the technical scope of the invention is not limited to the embodiment described below. Also, it should be noted that, although the description below is made with reference to the accompanying drawings, the scale of each of the members illustrated in each of the drawings may be appropriately changed so that each of the members has a recognizable size.

Figure 1:
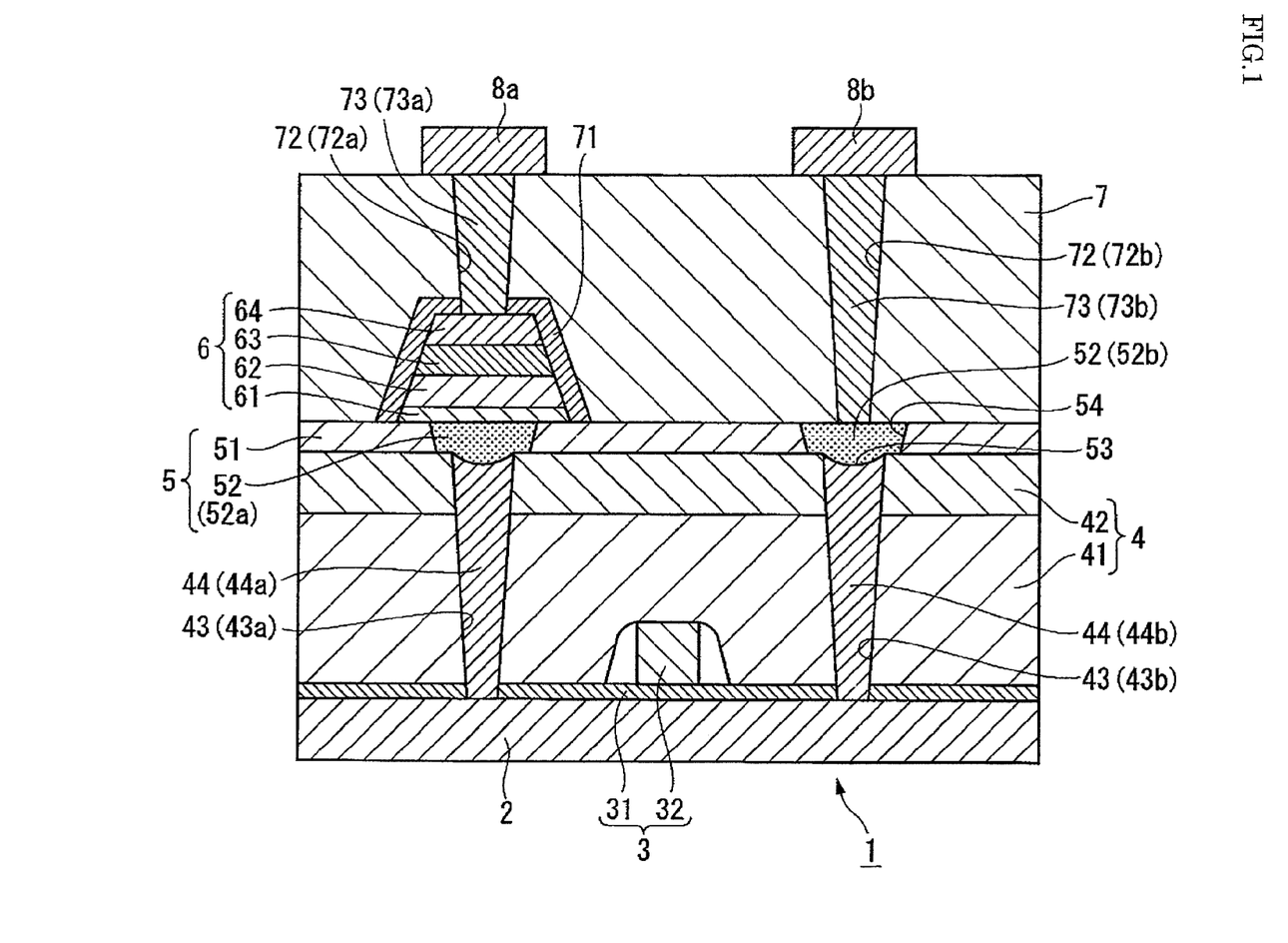
FIG. 1 is a cross-sectional view in part of a semiconductor device (ferroelectric memory device) in accordance with an embodiment of the invention.

FIG. 1 is a cross-sectional view in part of a ferroelectric memory device (semiconductor device) 1. The ferroelectric memory device 1 is equipped with a switching transistor 3 formed on a semiconductor substrate 2, a first interlayer dielectric film 4 covering the switching transistor 3, a spacer layer 5 in accordance with the invention provided on the first interlayer dielectric film 4, a ferroelectric capacitor 6 on the spacer layer 5, a second interlayer dielectric film 7 covering the ferroelectric capacitor 6, and wirings 8a and 8b provided on the second interlayer dielectric film 7.

The switching transistor 3 includes source/drain regions (not shown) and a channel region (not shown) formed in the surface layer section of the semiconductor substrate 2 composed of a silicon substrate, a gate dielectric film 31 formed on the channel region, and a gate electrode 32 formed on the gate dielectric film 31. It is noted that the switching transistors 3 that correspond to the respective ferroelectric capacitors 6 are electrically isolated from one another by embedded isolation regions (not shown) formed in the semiconductor substrate 2.

Also, a first interlayer dielectric film 4 that covers the switching transistor 3 is formed on the semiconductor substrate 2. The first interlayer dielectric film 4 of the present embodiment is formed from a first dielectric film 41 formed on the semiconductor substrate 2 and a second dielectric film 42 formed on the first dielectric film 41. The first dielectric film 41 may be composed of, for example, $SiO_2$ (silicon oxide), and the second dielectric film 42 may be composed of, for example, SiN (silicon nitride).

First contact holes (through holes) 43 are formed in a manner to penetrate through the first interlayer dielectric film 4, and first plug conductive layers 44 that may be composed of tungsten (W) or the like are embedded in the first contact holes 43. The first plug conductive layers 44 in accordance with the present embodiment are formed from a capacitor side first plug conductive layer 44a that connects one of the source and drain regions of the switching transistor 3 to the ferroelectric capacitor 6, and a wiring side first plug conductive layer 44b that connects the other of the source and drain regions of the switching transistor 3 to the upper wiring 8b.

The first plug conductive layers 44 have recesses (concave sections) 53 that are formed as a result of the tungsten surface being polished and dug when the first plug conductive layers 44 are formed. The depth of the recesses 53 may be about 20-30 nm. However, as the depth is influenced by differences in the polishing conditions, there are cases where no recess 53 may be formed, or very shallow recesses 53 may be formed.

Further, the spacer layer 5 in accordance with the invention is formed on the first interlayer dielectric film 4. The spacer layer 5 is formed from a spacer dielectric film 51 with hole sections 54 that connect to the first plug conductive layers 44 and each having a greater aperture diameter than that of the first contact hole 43, and spacer conductive sections 52 that are embedded within the hole sections 54 and the recesses 53. The spacer conductive sections 52 is formed from a capacitor side spacer conductive section 52a that connects the capacitor side first plug conductive layer 44a and the ferroelectric capacitor 6, and a wiring side spacer conductive section 52b that connects the wiring side first plug conductive layer 44b and a wiring side plug conductive layer 73b of a second plug conductive layer 73 to be described below. Also, the top surface of the spacer dielectric film 51 and the top surface of the spacer conductive section 52 are polished and sufficiently planarized by, for example, a CMP (chemical mechanical polishing) method.

The spacer dielectric film 51 may preferably be composed of a material that is different from the material of the second dielectric film 42 of the first interlayer dielectric film 4, and may be composed of, for example, $SiO_2$. The thickness of the spacer dielectric film 51 may preferably be sufficiently greater than the thickness (depth) of the recesses 53, and may be, for example, about 50-100 nm. Furthermore, the spacer conductive section 52 is composed of a conductive material having self-orientation characteristic, such as, for example, TiN (titanium nitride) and TiAlN (titanium aluminum nitride), in other words, a material containing Ti (titanium) that excels in self-orientation characteristic, and is composed of TiN in the present embodiment. The thickness of the spacer conductive section 52 equals to the sum of the thickness (depth) of the recess 53 and the thickness of the spacer dielectric film 51, and therefore can be controlled by the thickness of the spacer dielectric film 51.

Also, the ferroelectric capacitor 6 is formed on the spacer layer 5. The ferroelectric capacitor 6 is formed from a barrier film (conductive member) 61 formed on the spacer layer 5, a lower electrode 62 formed on the barrier film 61, a ferroelectric film 63 formed on the lower electrode 62, and an upper electrode 64 formed on the ferroelectric film 63.

The barrier film 61 is composed of, for example, TiAlN that functions as an oxygen barrier film. Also, the lower electrode 62 and the upper electrode 64 are formed from a good conductive material, such as, silver (Ag), platinum (Pt), iridium (Ir), iridium oxide ($IrO_2$) and the like. Also, the ferroelectric film 63 is composed of a material having perovskite type crystal structure that is expressed by a general formula $ABO_3$, and may be formed from, for example, PZT (Pb (Zr, Ti) $O_3$), PLZT ((Pb, La) (Zr, Ti) $O_3$), or a ferroelectric material in which metal such as niobate (Nb) or the like is added to the foregoing material. As the ferroelectric film 63 formed from a metal oxide, its ferroelectric characteristic may be deteriorated if exposed to a reducing atmosphere such as hydrogen gas.

Also, a hydrogen barrier film 71 composed of dielectric hydrogen barrier material such as $Al_2O_3$ or the like is formed on the side surface and the top surface of the ferroelectric capacitor 6 in a manner to cover these surfaces, and a second interlayer dielectric film 7 composed of $SiO_2$ or the like is formed in a manner to cover the hydrogen barrier film 71 and the spacer layer 5. Second contact holes (through holes) 72 that penetrate through the second interlayer dielectric film 7 and the hydrogen barrier film 71 are formed, and second plug conductive layers 73 composed of tungsten (W) or the like are embedded in the second contact holes 72. The second plug conductive layers 73 are formed from a capacitor side second plug conductive layer 73a that connects the ferroelectric capacitor 6 and the upper wiring 8a composed of Al or the like formed on the second interlayer dielectric film 7, and a wiring side second plug conductive layer 73b that connects the wiring side spacer conductive section 52b and the upper electrode 8b composed of Al or the like formed on the second interlayer dielectric film 7.

Next, a method for manufacturing a semiconductor device in accordance with an embodiment of the invention is described, using a manufacturing method applied for manufacturing the above-described ferroelectric memory device 1 as an example.

Figure 2A:
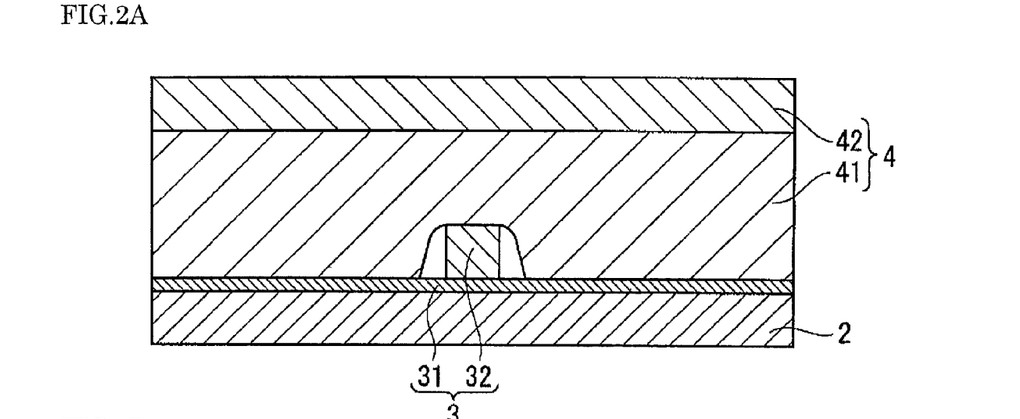
FIGS. 2A-2C are cross-sectional views showing steps of a method for manufacturing a semiconductor device (ferroelectric memory device).

First, as shown in FIG. 2A, a switching transistor 3 is formed on a semiconductor substrate 2 by a known method. Then, a film of $SiO_2$ (silicon oxide) that covers the switching transistor 3 is formed, thereby forming a first dielectric film 41 of a first interlayer dielectric film 4. Furthermore, a film of SiN (silicon nitride) is formed on the first dielectric film 41, thereby forming a second dielectric film 42 of the first interlayer dielectric film 4. These films may be formed by a spin coat method or a CVD method.

Figure 2B:
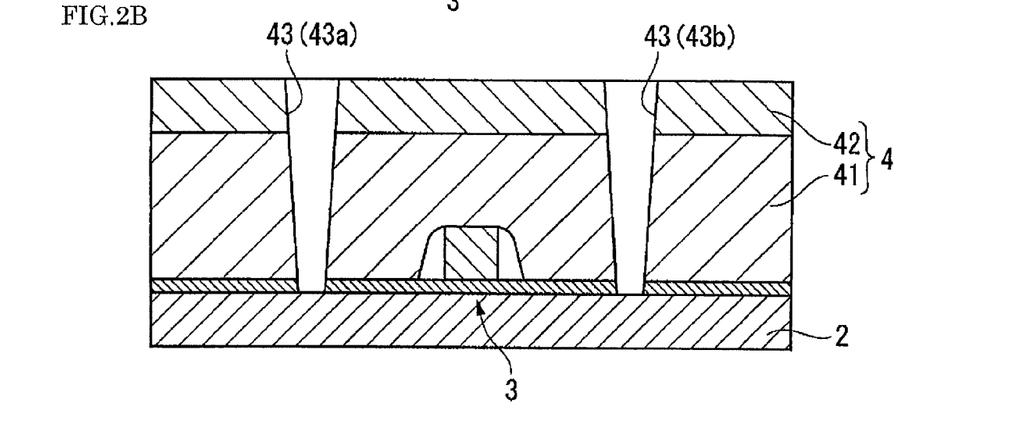

Then, a resist pattern (not shown) is formed on the second dielectric film 42 by a known method, and etching is conducted using the resist pattern as a mask, thereby etching the first dielectric film 41 and the second dielectric film 42 all together or independently form each other to form first contact holes 43, as shown in FIG. 2B.

Figure 2C:
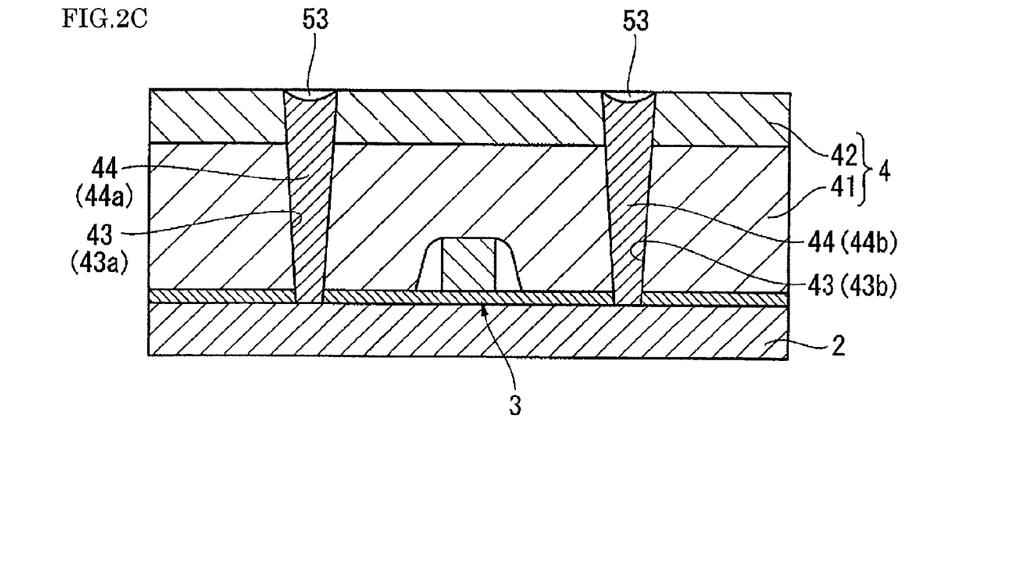

After removing the resist pattern, titanium (Ti) and titanium nitride (TiN) are deposited in films as adhesion layers within the first contact holes 43 by a sputter method or the like, and then a conductive material such as tungsten (W) or the like is deposited in a film and embedded in the first contact holes 43. Further, by applying a CMP (chemical mechanical polishing) method or the like, the conductive material on the second dielectric film 42 is removed, and the top surface of the second dielectric film 42 and the top surface of the conductive material (W) embedded in the first contact holes 43 are planarized, whereby first plug conductive layers 44 are formed, as shown in FIG. 2C. The first plug conductive layers 44 are formed from a capacitor side first plug conductive layer 44a that connects the switching transistor 3 to the side where a ferroelectric capacitor 6 is to be formed, and a wiring side first plug conductive layer 44b that connects the switching transistor 3 to the side where a upper wiring 8b is to be provided.

At this time, portions where tungsten (W) is excessively dug at the time of planarization by the CMP method are formed as recesses 53 (concave sections) in the top surface of the first plug conductive layers 44. The depth of the recesses 53 may be about 20-30 nm. However, as the depth is influenced by differences in the polishing conditions, there are cases where no recess 53 may be formed, or very shallow recesses 53 may be formed. As tungsten crystal is relatively large, and its crystal structure is rough, it is difficult to completely remove roughness (surface roughness) in the top surface of the first plug conductive layers 44, and cracks called seams (not shown) may be formed on the first plug conductive layers 44.

Figure 3A:
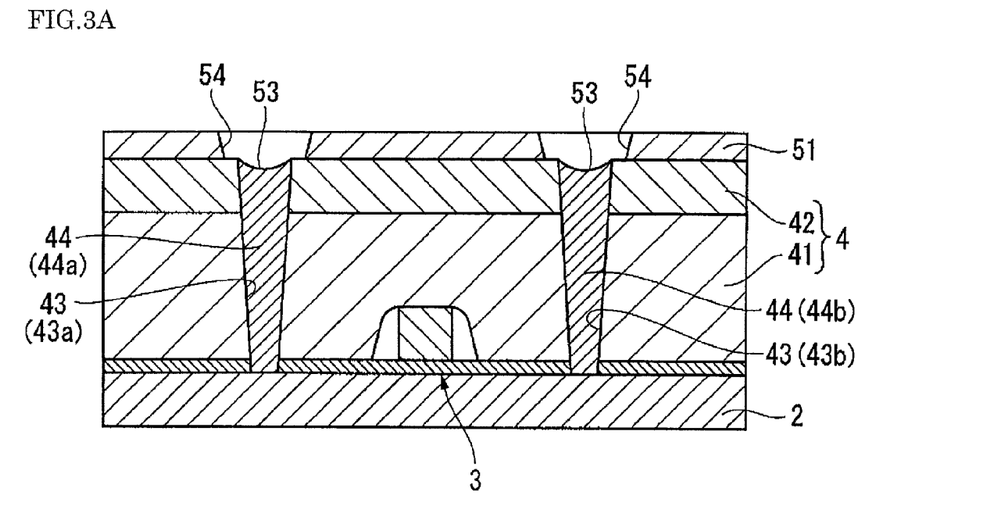
FIGS. 3A-3B are cross-sectional views showing steps of the method for manufacturing a semiconductor device (ferroelectric memory device).

Then, a $SiO_2$ film that covers the second dielectric film 42 and the first plug conductive layer 44 is formed. A resist pattern is formed on the $SiO_2$ film, and etching is conducted, using the resist pattern as a mask, thereby forming hole sections 54 that connect to the first plug conductive layers 44, and forming spacer dielectric film 51. In this instance, as the spacer dielectric film 51 is formed from a material different from that of the second dielectric film 42 of the first interlayer dielectric film 4, the second dielectric film 42 can stop etching even when over-etching occurs at the time of forming the hole sections. As a result, the hole sections 54 can be formed in a desired depth.

Figure 3B:
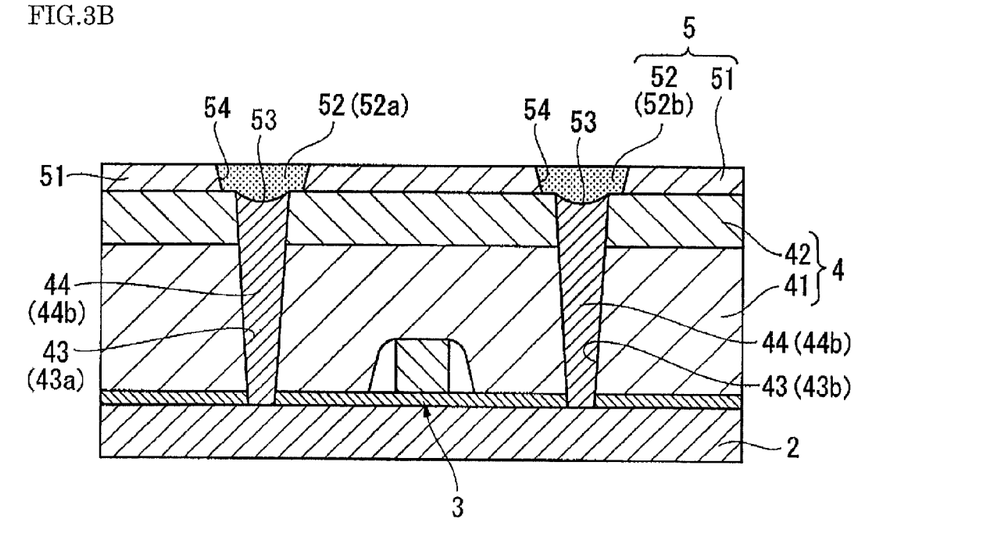

Then, after removing the resist pattern, a conductive film composed of a conductive material having self-orientation characteristic, such as, for example, TiN (titanium nitride) is formed by a sputter method or the like on the spacer dielectric film 51 in a manner to embed the hole sections 54 and the recesses 53. Further, by applying a CMP method or the like, the conductive material on the spacer dielectric film 51 is removed, and the top surface of the spacer dielectric film 51 and the top surface of the conductive film embedded in the hole sections 54 are planarized, whereby spacer conductive sections 52 are formed, as shown in FIG. 3B. As the spacer conductive sections 52, there are formed a capacitor side spacer conductive section 52a that connects the capacitor side first plug conductive layer 44a to the side where the ferroelectric capacitor is to be provided, and a wiring side spacer conductive section 52b that connects the wiring side first plug conductive layer 44b to the side where the wiring side second plug conductive layer is to be provided.

The thickness of the spacer conductive section 52 equals to the sum of the thickness of the spacer dielectric film 51 and the thickness (depth) of the recess 53. As the spacer dielectric film 51 is formed to a predetermined thickness, the spacer conductive sections 52 have sufficient thickness, such that the spacer conductive sections 52 can be prevented from being removed when the top surface of the spacer dielectric film 51 is polished by a CMP method. Accordingly, the roughness and seams in the top surface of the first plug conductive layers 44 can be securely covered by lids formed by the spacer conductive sections 52. Furthermore, as the spacer conductive sections 52 are made of a material having self-orientation characteristic, deviations in the crystal orientation that may be caused by the roughness and seams in the surface of the first plug conductive layers 44 can be securely prevented from being created on the spacer conductive sections 52.

Then, a film of TiAlN is formed by a sputter method on the capacitor side spacer conductive section 52a, thereby forming a conductive member (barrier film) 61. It is noted that, because the capacitor side spacer conductive section 52a is formed with good crystal orientation, the barrier film 61 is also formed with good crystal orientation.

Figure 4A:
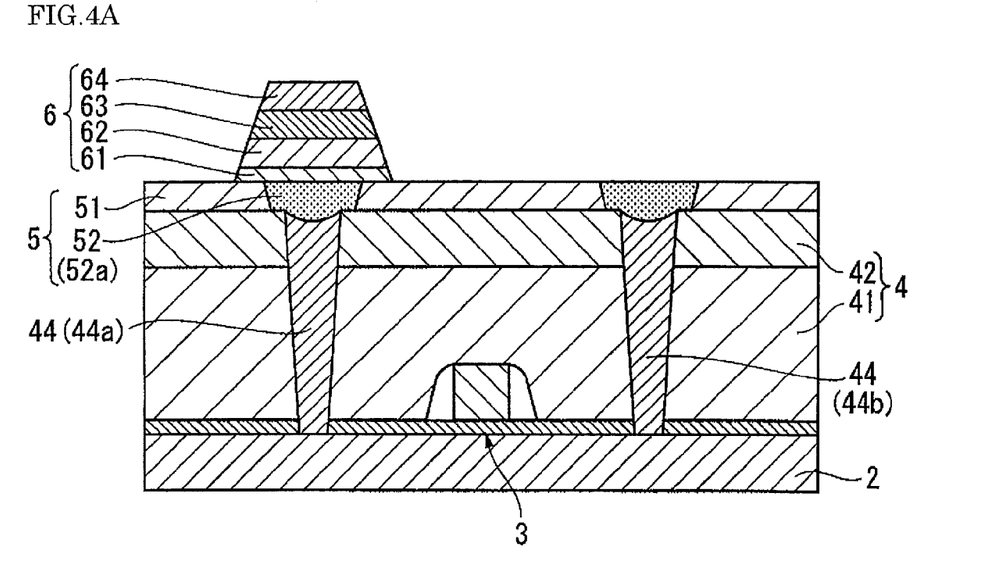
FIGS. 4A-4B are cross-sectional views showing steps of the method for manufacturing a semiconductor device (ferroelectric memory device).

Then, for example, films of Ir, $IrO_2$ and Pt are successively formed on the barrier film 61 by using, for example, a sputter method, thereby forming a lower electrode 62. As described above, the barrier film 61 has excellent crystal orientation, such that the lower electrode 62 can also have excellent crystal orientation. Furthermore, a PZT film is formed on the lower electrode 62 to a film thickness of, for example, 100 nm by a sol-gel method, a sputter method, or a MOCVD method, thereby forming a ferroelectric film 63. Because the lower electrode 62 has excellent crystal orientation, the ferroelectric film 63 can also have excellent crystal orientation. Then, for example, films of Pt, $IrO_2$ and Ir are successively formed on the ferroelectric film 63 by using, for example, a sputter method, thereby forming an upper electrode 64. As described above, the ferroelectric film 63 has excellent crystal orientation, such that the upper electrode 64 can also have good crystal orientation. Then, a resist pattern (not shown) is formed on the upper electrode 64, and the upper electrode 64, the ferroelectric film 63, the lower electrode 62 and the conductive member (barrier film) 61 are etched by using the resist pattern as a mask, whereby a ferroelectric capacitor 6 is formed on the spacer layer 5, as shown in FIG. 4A. The ferroelectric capacitor 6 has excellent ferroelectric characteristic, as the ferroelectric film 63 is provided with excellent crystal orientation.

Next, a film of $Al_2O_3$ is formed by a sputter method in a manner to cover the upper surface and the top surface of the ferroelectric capacitor 6, a resist pattern (not shown) is formed on the film, and the film is etched by using the resist pattern as a mask, whereby a hydrogen barrier film 71 is formed. Then, for example, a film of $SiO_2$ that covers the hydrogen barrier film 71 is formed, and then planarized by a CMP process, thereby forming a second interlayer dielectric film 7. After forming the second interlayer dielectric film 7, second contact holes (through holes) 72 are formed by a photolithography method and a dry etching method. As the second contact holes 72, a contact hole 72a that connects the top surface of the second interlayer dielectric film 7 to the top surface of the upper electrode 64 of the ferroelectric capacitor 6, and a second contact hole 72b that connects the top surface of the second interlayer dielectric film 7 to the wiring side spacer conductive section 52b are formed. Then, second plug conductive layers 73 are formed in the second contact holes 72, by a similar method applied in forming the first plug conductive layers 44. In the present embodiment, as shown in FIG. 4B, a capacitor side second plug conductive layer 73a is formed on the ferroelectric capacitor 6, and a wiring side second plug conductive layer 73b is formed on the wiring side spacer conductive section 52b.

Because the capacitor side second plug conductive layer 73a is formed on the upper electrode 64 having excellent crystal orientation, tungsten filling defect that may be caused by the roughness and seams in the surface of the first plug conductive layer 44 can be prevented when the capacitor side second plug conductive layer 73a is formed. Therefore, weak points are prevented from being formed at the bottom surface side of the capacitor side second plug conductive layer 73a, such that penetration of hydrogen gas and water through such weak points into the ferroelectric capacitor and the resultant deterioration can be prevented.

Figure 4B:
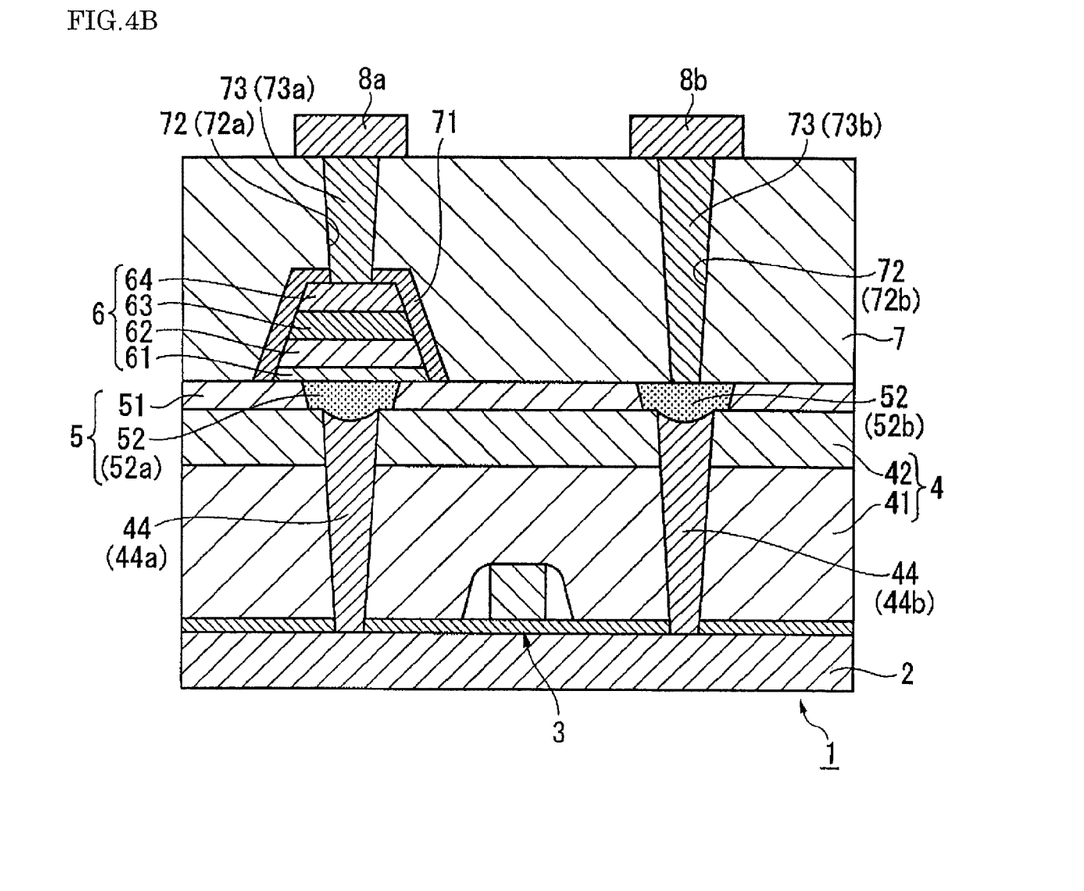

Then, upper wirings 8a and 8b composed of aluminum or the like are formed on the second interlayer dielectric film 7 at places corresponding to the second plug conductive layers 73, whereby a ferroelectric memory device (semiconductor device) 1 is formed, as shown in FIG. 4B.

In the ferroelectric memory device (semiconductor device) 1 formed by the manufacturing method described above, the roughness and seams in the top surface of the first plug conductive layers 44 are securely covered by the spacer conductive sections 52. Therefore, deviations in the crystal orientation that may be caused by the roughness and seams in the surface of the spacer conductive sections 52 can be prevented from occurring on the ferroelectric capacitor 6. Accordingly, the ferroelectric capacitor has excellent crystal orientation, and therefore the ferroelectric memory device 1 has excellent hysteresis characteristic.

Also, as the ferroelectric capacitor 6 is formed with excellent crystal orientation, weak points are prevented from being formed at the bottom surface side of the capacitor side second plug conductive layer 73a on the ferroelectric capacitor 6, and therefore penetration of hydrogen gas and water through such weak points into the ferroelectric capacitor and the resultant deterioration can be prevented. Accordingly, in the ferroelectric memory device 1, differences in the characteristic of the ferroelectric capacitors 6 can be reduced.

It is noted that the capacitor side spacer conductive section 52a and the conductive member (barrier film) 61 are composed of different materials in the present embodiment, but they may be composed of the same material. By so doing, the barrier film 61 can be formed by the same method that is applied for forming the capacitor side spacer conductive section 52a. Also, the spacer dielectric film 51 may be formed with a material having hydrogen barrier characteristic such as $Al_2O_3$. By so doing, penetration of hydrogen gas and water from the side of the first interlayer dielectric film 4 into the ferroelectric capacitor 6 can be prevented, such that reduction of the ferroelectric capacitor 6 and its resultant deterioration can be prevented. Also, the hydrogen barrier film 71 may be formed not only to cover solely the ferroelectric capacitor 6 but also to cover the spacer dielectric film 51. Moreover, the spacer layer 5 in accordance with the present invention is not limited to connecting to the ferroelectric capacitor, but is also applicable to connecting plugs, as used in the case of the present embodiment in connecting the wiring side first plug conductive layer 44b and the wiring side second plug conductive layer 73b, and is also applicable to other semiconductor devices that do not use ferroelectric materials.

What is claimed is:

1. A semiconductor device, comprising:
   a substrate;
   a first dielectric film formed above the substrate;
   a second dielectric film formed above the first dielectric film;
   a plug formed in the first dielectric film; and
   a spacer conductive portion having a self-orientation characteristic formed in the second dielectric film such that the spacer conductive portion is directly disposed on the plug, a width of the spacer conductive portion being larger than a width of the plug in a cross-sectional view, and a surface of the second dielectric film and a surface of the spacer conductive portion being planarized,
   wherein an upper surface of the plug includes a recessed portion that is filled by the spacer conductive portion.

2. The semiconductor device according to claim 1, wherein the second dielectric film has a barrier property against hydrogen.

3. The semiconductor device according to claim 1, wherein the first dielectric film is formed from dielectric films in two or more layers, and at least a topmost layer among the dielectric films is composed of a material different from a material of the second dielectric film.

4. The semiconductor device of claim 1, wherein the spacer conductive portion has a first portion and a second portion, a thickness of the first portion being greater than a thickness of the second portion, and the first portion contacting the plug.

5. The semiconductor device according to claim 1, further comprising:
   a first barrier layer formed on the second dielectric layer and the spacer conductive portion;
   a first electrode formed on the first barrier layer;
   a ferroelectric film formed on the first electrode; and
   a second electrode formed on the ferroelectric film, a width of the first barrier layer being greater than the width of the spacer conductive portion.

6. The semiconductor device according to claim 5, wherein the spacer conductive portion and the first barrier layer are formed of the same material, and the spacer conductive portion is formed of a different material than the plug.

7. The semiconductor device according to claim 6, wherein the spacer conductive portion and the first barrier film are formed of TiAlN.

8. The semiconductor device according to claim 1, further comprising:
   a transistor having a source region and a drain region formed on the substrate;
   a second plug formed in the first dielectric film;
   a second spacer conductive portion having a self-orientation characteristic formed in the second dielectric film such that the spacer conductive portion is directly disposed on the second plug, a width of the second spacer conductive portion being larger than a width of the second plug in a cross-sectional view, and the surface of the second dielectric film and a surface of the second spacer conductive portion being planarized; and
   a capacitor formed on the plug,
   wherein the plug is formed on the source region and the second plug is formed on the drain region.

9. The semiconductor device of claim 8, further comprising wirings in communication with the plug and the second plug.

10. The semiconductor device of claim 8, wherein an upper surface of the plug and the second plug each include a recessed portion that is filled by the spacer conductive portion and the second spacer conductive portion, respectively.

11. A semiconductor device, comprising:
    a substrate;
    a transistor having a source region and a drain region formed on the substrate;
    a first dielectric film formed above the substrate;
    a second dielectric film formed above the first dielectric film;
    a first plug formed in the first dielectric film;
    a second plug formed in the first dielectric film;
    a first spacer conductive portion having a self-orientation characteristic formed in the second dielectric film such that the first spacer conductive portion is directly disposed on the first plug, a width of the first spacer conductive portion being larger than a width of the first plug in a cross-sectional view, and a surface of the second dielectric film and a surface of the first spacer conductive portion being planarized;

a second spacer conductive portion having a self-orientation characteristic formed in the second dielectric film such that the second spacer conductive portion is directly disposed on the second plug, a width of the second spacer conductive portion being larger than a width of the second plug in a cross-sectional view, and the surface of the second dielectric film and a surface of the second spacer conductive portion being planarized; and
a capacitor formed on the first plug,
wherein the first plug is formed on the source region and the second plug is formed on the drain region; and
an upper surface of the first plug and the second plug each include a recessed portion that is filled by the first spacer conductive portion and the second spacer conductive portion, respectively.

* * * * *